US008306799B2

(12) United States Patent
Takamoto et al.

(10) Patent No.: US 8,306,799 B2
(45) Date of Patent: Nov. 6, 2012

(54) DEVOLATILIZATION PERFORMANCE PREDICTION APPARATUS AND DEVOLATILIZATION PERFORMANCE PREDICTION METHOD

(75) Inventors: Seiji Takamoto, Hiroshima (JP); Shigeki Inoue, Hiroshima (JP); Hideki Tomiyama, Hiroshima (JP); Hiroaki Shintani, Hiroshima (JP); Kenji Inagawa, Hiroshima (JP)

(73) Assignee: The Japan Steel Works, Ltd, Tokyo (JP)

( * ) Notice: Subject to any disclaimer, the term of this patent is extended or adjusted under 35 U.S.C. 154(b) by 877 days.

(21) Appl. No.: 12/442,009

(22) PCT Filed: Aug. 27, 2007

(86) PCT No.: PCT/JP2007/066521
§ 371 (c)(1),
(2), (4) Date: Mar. 20, 2009

(87) PCT Pub. No.: WO2008/035541
PCT Pub. Date: Mar. 27, 2008

(65) Prior Publication Data
US 2010/0023306 A1 Jan. 28, 2010

(30) Foreign Application Priority Data
Sep. 19, 2006 (JP) .................. 2006-253148

(51) Int. Cl.
*G06G 7/50* (2006.01)
(52) U.S. Cl. .......................... 703/9; 156/500
(58) Field of Classification Search ...... 703/9; 156/500; 264/1.29
See application file for complete search history.

(56) References Cited

U.S. PATENT DOCUMENTS

| 6,881,363 B2 * | 4/2005 | Carlson et al. .................. 506/37 |
| 2001/0028122 A1 * | 10/2001 | Narushima et al. .......... 264/40.1 |
| 2004/0111246 A1 * | 6/2004 | Williams .......................... 703/9 |

FOREIGN PATENT DOCUMENTS

| JP | 04-364921 | 12/1992 |
| JP | 05-050491 | 3/1993 |
| JP | 07-088927 | 4/1995 |
| JP | 09-029819 | 2/1997 |
| JP | 10-244579 | 9/1998 |
| JP | 11-245280 | 9/1999 |
| JP | 2004-148722 | 5/2004 |
| JP | 2007-261080 | 10/2007 |

OTHER PUBLICATIONS

PolyTech, "Twin-Screw Extruder Simulator (TXS tm)" Demo Version 2.3, May 2006, 17 pages.*
Ramon J. Albalak, Zehev Tadmor, Yeshayahu Talmon, "Polymer Melt Devolatilization Mechanisms", AIChe Journal, Sep. 1990, vol. 36, No. 9 pp. 1313-1320.*

(Continued)

*Primary Examiner* — Dwin M Craig
(74) *Attorney, Agent, or Firm* — Turocy & Watson, LLP

(57) ABSTRACT

A devolatilization performance prediction apparatus for a solution devolatilization process using a twin-screw extruder is described. The devolatilization performance prediction apparatus determines a flow state of the solution in the twin-screw extruder, simulates the solution devolatilization process based on the flow state, and predicts a performance of a devolatilization process conducted with the twin screw extruder based on the simulation.

8 Claims, 10 Drawing Sheets

$D$ : CYLINDER INNER DIAMETER (m),
$N$ : NUMBER OF REVOLUTIONS PER UNIT TIME OF SCREW ($s^{-1}$),
$\theta$ : HELIX ANGLE OF SCREW FLIGHT (deg.)

OTHER PUBLICATIONS

International Search Report for PCT/JP2007/066521 dated Oct. 30, 2007.
Written Opinion for PCT/JP2007/066521 dated Oct. 30, 2007.
European Search Report for 07 79 2998 mailed on Jul. 2, 2010.
Collins, et al. Determination of Mass Transfer Coefficients for Bubble-Free Devolatization of Polymeric Solutions in Twin-Screw Extruders, Aiche Journal, vol. 31, No. 8, Aug. 1985, pp. 1288-1296, XP002587281.
Latinen. Devolatilization of Viscous Polymer Systems, Advances in Chemistry Series, American Chemical Society, Jan. 1, 1962, pp. 235-246, XP009133878.
Biesenberger, et al. Devolatilization of Polymer Melts: Machine Geometry and Scale Factors, Polymer Engineering & Science, vol. 30, No. 23, Dec. 31, 1990, pp. 1493-1499, XP002584055.
Kretschmer, et al. Computer Aided Simulation of Co-Rotating Twin Screw Extruders, KGK Kautschuk Gummi Kunststoffe, vol. 58, No. 5, May 2005, pp. 246-251, XP002587282.

* cited by examiner

D : CYLINDER INNER DIAMETER (m),
N : NUMBER OF REVOLUTIONS PER UNIT
  TIME OF SCREW (s$^{-1}$),
$\theta$ : HELIX ANGLE OF SCREW FLIGHT (deg.)

D : CYLINDER INNER DIAMETER (m),
N : NUMBER OF REVOLUTIONS PER UNIT
  TIME OF SCREW (s$^{-1}$),
n : NUMBER OF THREADS OF SCREW FLIGHT

FIG.10

| SCREW No. | PROCESSING RATE (Q) /kg/h | REVOLUTIONS PER UNIT TIME OF SCREW (Ns) /rpm | Q/Ns | BARREL TEMPERATURE /°C | VACUUM DEGREE /×10⁻³MPa | FRONT END RESIN PRESSURE /MPa | EJECTED RESIN TEMPERATURE /°C | ENTRANCE n-HEXANE CONCENTRATION ($C_0$) /ppm | EXIT n-HEXANE CONCENTRATION ($C_L$) /ppm |
|---|---|---|---|---|---|---|---|---|---|
| 1 | 150 | 100 | 1.50 | 200 | 4 | 1.6 | 231 | 3000 | 1154 |
|  | 150 | 150 | 1.00 | 200 | 4 | 1.4 | 240 | 3000 | 806 |
|  | 150 | 200 | 0.75 | 200 | 4 | 0.4 | 248 | 3000 | 691 |
|  | 250 | 167 | 1.50 | 200 | 4 | 0.8 | 244 | 3000 | 1017 |
|  | 250 | 250 | 1.00 | 200 | 4 | 0.8 | 250 | 3000 | 934 |
| 2 | 150 | 100 | 1.50 | 200 | 4 | 1 | 229 | 3000 | 832 |
|  | 150 | 150 | 1.00 | 200 | 4 | 0.8 | 238 | 3000 | 805 |
|  | 150 | 200 | 0.75 | 200 | 4 | 0.7 | 245 | 3000 | 464 |
|  | 250 | 167 | 1.50 | 200 | 4 | 1.3 | 239 | 3000 | 1189 |
|  | 250 | 250 | 1.00 | 200 | 4 | 1.2 | 250 | 3000 | 826 |

DEVOLATILIZATION PERFORMANCE PREDICTION APPARATUS AND DEVOLATILIZATION PERFORMANCE PREDICTION METHOD

TECHNICAL FIELD

The present invention relates to a method of predicting the devolatilization performance of a devolatilization process using a twin-screw extruder.

BACKGROUND ART

Conventionally, the Latinen's model formula shown below as formula (1) is popularly employed as devolatilization performance prediction method for devolatilizing operations using a screw extruder:

$$Ln(C_0-C^*)/(C_L-C^*)=K\rho SL(DdN)^{1/2}/Q \qquad (1),$$

where $C_0$ is the volatile mass concentration (ppm) at the entrance of the devolatilization region (immediately before devolatilization), $C_L$ is the volatile mass concentration (ppm) after devolatilization, $C^*$ is the gas-liquid equilibrium concentration (ppm) of volatile mass and nonvolatile mass (solution of polymer and/or rubber) under the pressure/temperature conditions for devolatilization, K is the mass transfer coefficient, $\rho$ is the density (kg/m$^3$) of the nonvolatile mass solution containing volatile mass, S is the boundary film surface length (m) of the nonvolatile mass solution containing volatile mass in a cross section orthogonal relative to the extruder screw flight, L is the flow path length (m) of the nonvolatile mass solution containing volatile mass in the devolatilization region, Dd is the diffusion coefficient (m$^2$/s) of the volatile mass contained in the nonvolatile mass solution, N is the screw rotational speed (s$^{-1}$) and Q is the overall processing rate (kg/s).

FIG. 16 of the accompanying drawings schematically illustrates a known twin-screw extruder, showing the configuration thereof. The above Latinen's module formula predicts the concentration of the residual volatile mass after devolatilization by way of the product of multiplication of the totalized area of the boundary film (exposed surface layer) of the nonvolatile mass containing volatile mass that is updated by revolutions of the screw in the devolatilization region of the twin-screw extruder as shown in FIG. 16 and the diffusion rate of volatile mass from the nonvolatile mass, or the ratio of the weight of the nonvolatile mass containing devolatilized volatile mass to the weight of the nonvolatile mass containing the entire volatile mass.

In FIG. 16, 100 denotes a barrel that can be heated and cooled, 200 and 300 respectively denote a screw and a vent (an aperture for removing the isolated volatile mass) and 401 and 402 denote respective kneading screws, while 501 and 502 denote parts totally filled with nonvolatile mass containing volatile mass in the barrel and 600 denotes a part (devolatilization region) that is not totally filled with nonvolatile mass containing volatile mass and hence nonvolatile mass is flowing.

In the Latinen's model formula, each of $C_0$, $C^*$, $C_L$, $\rho$ and Dd represents a characteristic factor of a nonvolatile mass, a volatile mass or a nonvolatile mass solution containing volatile mass and N and Q represent operation factors of an extruder. These factors can vary according to the environment and conditions of devolatilization operation.

"SL(DdN)$^{1/2}$" in the Latinen's model formula can be substituted by "SL(Dd/(1/N))$^{1/2}$" and regarded as the exposed surface layer of the nonvolatile mass solution containing volatile mass that is formed in the barrel and the screw per unit time.

DISCLOSURE OF THE INVENTION

Problem to be Solved by the Invention

However, in a twin-screw extruder, the nonvolatile mass solution containing volatile mass is incessantly flowing in the screw and hence both the profile of the solution formed in the barrel and the screw by the revolutions of the screw in the devolatilization region and the exposed surface layer are changing incessantly.

The Latinen's model formula does not take the flow behavior of the solution into consideration and hence cannot accurately predict the devolatilization performance by way of the surface updating behavior of the solution.

In view of the above-identified problem, it is therefore the object of the present invention to provide a technique that can more accurately predict the devolatilization performance of a twin-screw extruder in a highly adaptable manner.

Means for Solving the Problem

In an aspect of the present invention, the above problem is solved by providing a devolatilization performance prediction apparatus for a solution devolatilization process using a twin-screw extruder, including: a flow state computation means (101) for computationally determining information relating to the flow state of the solution existing in a devolatilization region (600), or a target region, of a devolatilization process on a screw (200) conveying solution of nonvolatile mass containing volatile mass according to the flow state of the solution (700) existing on the channel surface at the upstream side in the conveying direction of the screw channel, the solution (800) existing in the gap between the screw (200) and a barrel (100) and the solution (900) existing on the channel surface at the downstream side in the conveying direction of the screw channel; and a devolatilization performance prediction means (102) for predicting the devolatilization performance in the devolatilization process according to the information relating to the flow state computationally determined according to the flow state of the solution existing on the screw (200).

In another aspect of the present invention, there is provided a devolatilization performance prediction method for a solution devolatilization process using a twin-screw extruder, including: computationally determining information relating to the flow state of solution existing in a devolatilization region (600), or a target region, of a devolatilization process on a screw (200) conveying the solution of nonvolatile mass containing volatile mass according to the flow state of the solution (700) existing on the channel surface at the upstream side in the conveying direction of the screw channel, the solution (800) existing in the gap between the screw (200) and a barrel (100) and the solution (900) existing on the channel surface at the downstream side in the conveying direction of the screw channel; and predicting the devolatilization performance in the devolatilization process according to the information relating to the flow state computationally determined according to the flow state of the solution existing on the screw (200).

BRIEF DESCRIPTION OF THE DRAWINGS

FIG. 10 is a table summarily showing the results of the experiment.

BEST MODE FOR CARRYING OUT THE INVENTION

Figure 16:
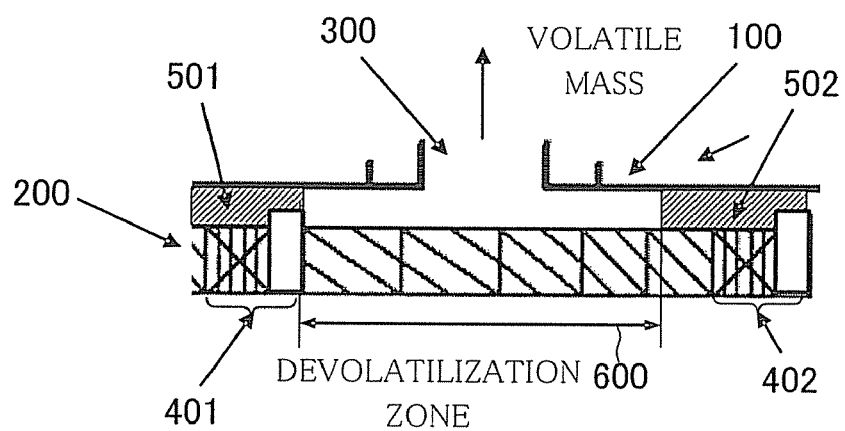
FIG. 16 is a schematic illustration of a known twin-screw extruder, showing the configuration thereof.

Now, the present invention will be described in greater detail by referring to the accompanying drawings that illustrate an embodiment of the invention. Since the devolatilization performance prediction apparatus M of this embodiment is applicable to a twin-screw extruder having a configuration similar to the one illustrated in FIG. 16, the parts similar to those described above for the prior art will be denoted respectively by the same reference symbols and will not be described below any further.

Figure 1:
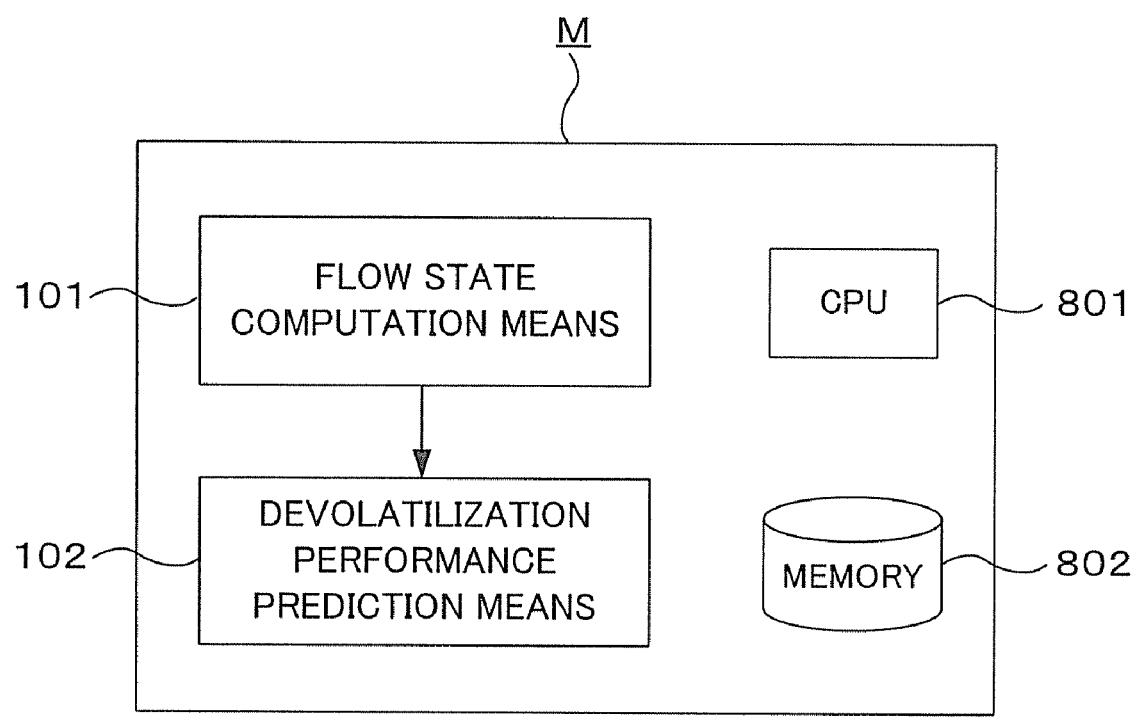
FIG. 1 is a schematic functional block diagram of an embodiment of devolatilization performance prediction apparatus M.

FIG. 1 is a schematic functional block diagram of the devolatilization performance prediction apparatus M of this embodiment. As shown in FIG. 1, the devolatilization performance prediction apparatus M of this embodiment includes a flow state computation means 101, a devolatilization performance prediction means 102, a CPU 801 and a MEMORY 802 and is designed to predict the devolatilization performance of a twin-screw extruder in a solution devolatilization process.

The flow state computation means 101 has a function of computationally determining information relating to the flow state of the nonvolatile mass solution that contains volatile mass and is held on a screw 200 as object in a devolatilization region 600 as object of a devolatilization process according to the flow state of the solution 700 existing on the channel surface at the upstream side in the conveying direction of the screw channel, the solution 800 existing in the gap between the screw 200 and a barrel 100 and the solution 900 existing on the channel surface at the downstream side in the conveying direction of the screw channel.

The devolatilization performance prediction means 102 has a function of predicting the devolatilization performance of the twin-screw extruder in the devolatilization process according to the information relating to the flow state of the solution that is computationally determined according to the flow state of the solution existing on the screw 200. The prediction method that the devolatilization performance prediction means 102 employs for predicting the devolatilization performance will be described in greater detail hereinafter.

The CPU 801 takes a role of executing various processes in the devolatilization performance prediction apparatus M and also a role of realizing various functions by executing the programs stored in the MEMORY 802. The MEMORY 802 typically includes a ROM and a RAM and takes a role of storing various pieces of information and various programs to be utilized by the devolatilization performance prediction apparatus M.

Figure 2:
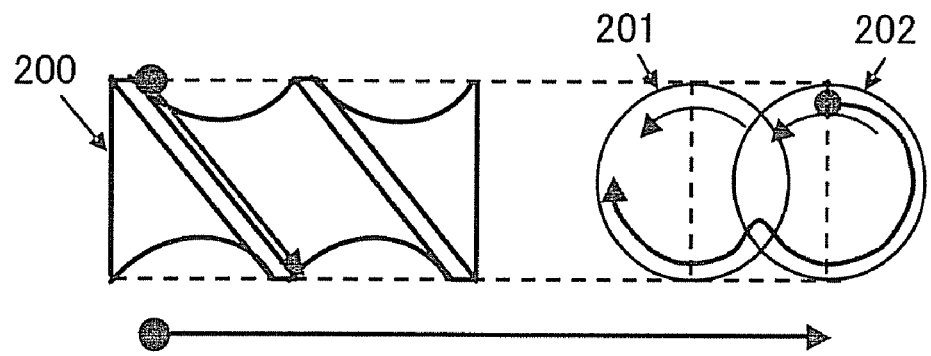
FIG. 2 is an illustration of the flow path per piece of screw of the embodiment.

The nonvolatile mass solution containing volatile mass is flowing in the devolatilization region in a state where it does not fill the screw channel. The flow path length of the nonvolatile mass solution containing volatile mass along the extruder screw flight of the nonvolatile mass solution is obtained by determining the flow path $L_1$ per piece of the twin-screw that is fully intermeshing as shown in FIG. 2 by means of the formulas shown below and totalizing the polymer flow paths of the screw in the devolatilization region shown in FIG. 16:

$$L_1 = (3/4 + 2B)C/n \qquad (2),$$

$$B = (90 - \cos^{-1}(W/D))/360 \qquad (3) \text{ and}$$

$$C = \pi(D-H)/\cos\theta \qquad (4),$$

where n is the number of threads of the screw flight, D is the cylinder inner diameter (m), W is the inter-shaft distance of the twin-screw (m), H is the depth of the screw channel (m) and θ is the helix angle (deg.) of the screw flight.

Figure 3:
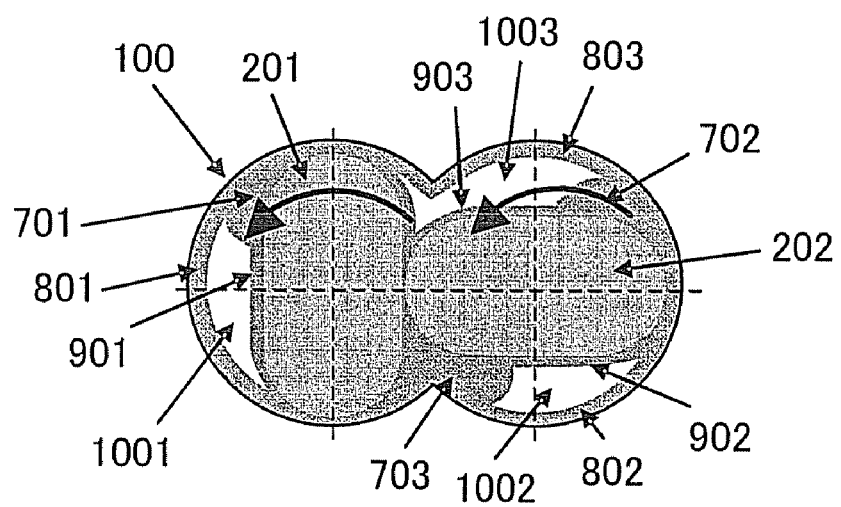
FIG. 3 is a schematic cross-sectional view of the screw of the embodiment taken along a plane orthogonal relative to the screw shafts, showing a state of being filled with nonvolatile mass solution containing volatile mass formed in the barrel and the screw.

Considering the flow state of the solution through a cross section orthogonal relative to the screw shafts, the solution is divided into three areas and flows as shown in FIG. 3 in the case of a double-thread flight screw.

Figure 4:
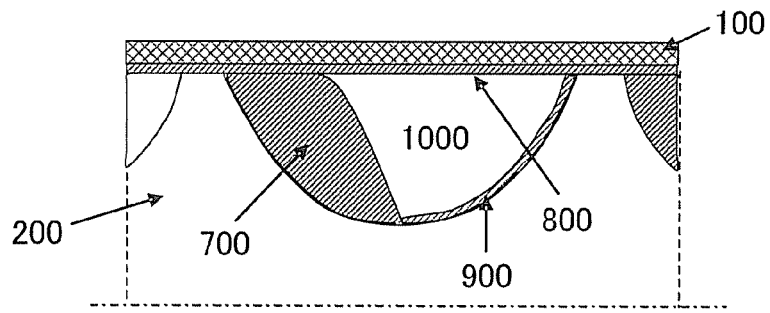
FIG. 4 is a schematic illustration of the screw of the embodiment taken along a plane orthogonal relative to the screw flight, showing a state of being filled with nonvolatile mass solution existing in the screw channel and containing volatile mass when no surface update is taken into consideration.

FIG. 4 is a schematic illustration of the twin-screw taken along a plane orthogonal relative to the screw flight, showing a state of being fully filled with nonvolatile mass solution existing in the screw channel and containing volatile mass when no surface update is taken into consideration. The state of the nonvolatile mass solution containing volatile mass that fills the screw channel is produced by three profiles as listed below that show different flow states found in the screw channel.
(1) The profile of the solution existing on the channel surface (part filled with solution) at the upstream side in the conveying direction of the screw channel.
(2) The profile of the thin film existing in the gap (tip section) between the screw and the barrel.
(3) The profile of the thin film formed in the part of the screw channel that is not fully filled with solution.

Figure 5:
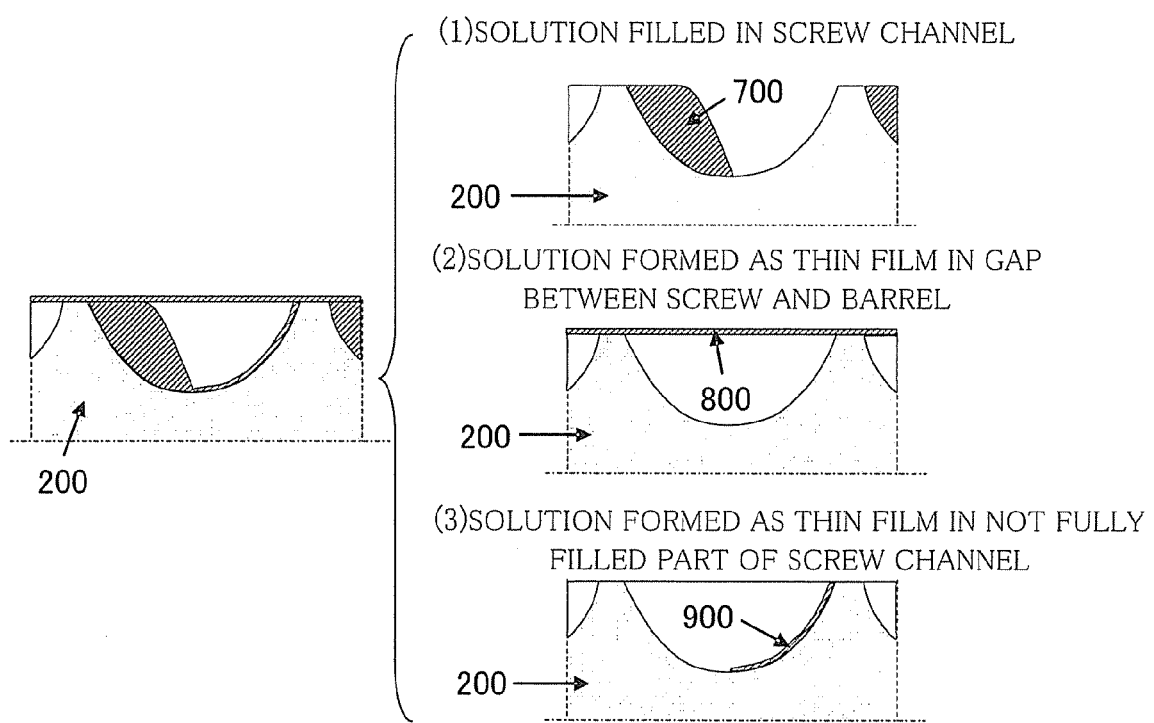
FIG. 5 is schematic cross sectional views of the screw channel orthogonal relative to the screw flight of the embodiment, showing the state of being filled with nonvolatile mass solution containing volatile mass formed in the barrel and the screw channel.

The devolatilization performance prediction means 102 can predict the devolatilization performance to more clarify the exposed surface area by means of the formula shown below and by separating three profiles in a manner as shown in FIG. 5 and taking the surface update efficiency into consideration:

$$Ln(C_0-C^*)/(C_L-C^*)=(K_1(2n-1)\rho S_1 L(DdN)^{1/2}+\beta K_2\rho S_2 L_2(DdN)^{1/2}+\gamma K_3\rho S_3 L(DdN)^{1/2})/Q \qquad (5),$$

where L is the flow path length (m) of the nonvolatile mass solution (solution of polymer or rubber) containing volatile mass in the devolatilization region (600), $L_2$ is the length of the devolatilization region in the direction of the screw shafts, $C_0$ is the volatile mass concentration (ppm) at the entrance of the devolatilization region, $C^*$ is the gas-liquid equilibrium concentration (ppm) of volatile mass and nonvolatile mass under the pressure/temperature conditions for devolatilization, $C_L$ is the volatile mass concentration (ppm) after devolatilization, $K_1$ is the ratio of the length of the exposed surface formed by a surface update flow within the residence time of staying in the devolatilization region to the length of the exposed surface of a profile for which no surface update is taken into consideration (surface update efficiency 1), $K_2$ is the ratio of the time taken to update the exposed surface at the average velocity of flow between the barrel (100) and the screw (200) to the residence time in the devolatilization region (surface update efficiency 2), $K_3$ is the ratio of the time taken for updating the exposed surface at the peripheral speed of the intermeshing part of the screw to the residence time in the devolatilization region (surface update efficiency 3), $\rho$ is the density (kg/m$^3$) of the nonvolatile mass solution containing volatile mass, $S_1$ is the length of the exposed surface (m) of a profile for which the filling ratio of the nonvolatile mass solution containing volatile mass filling the screw channel is taken into consideration but no surface update is taken into consideration, $S_2$ is the barrel inner surface length (m), $S_3$ is the length of the part of the screw channel not fully filled with solution, Dd is the diffusion coefficient (m$^2$/s) of the volatile mass contained in the nonvolatile mass solution, N is the screw rotational speed (s$^{-1}$), n is the number of threads of the screw flight, $\beta$ is the thin film forming efficiency of forming a thin film of solution in the gap (tip section) produced between the barrel (100) and the screw (200), $\gamma$ is the thin film forming efficiency of forming a thin film in the part of the screw channel not fully filled with solution and Q is the overall processing rate (kg/s).

Figure 6:
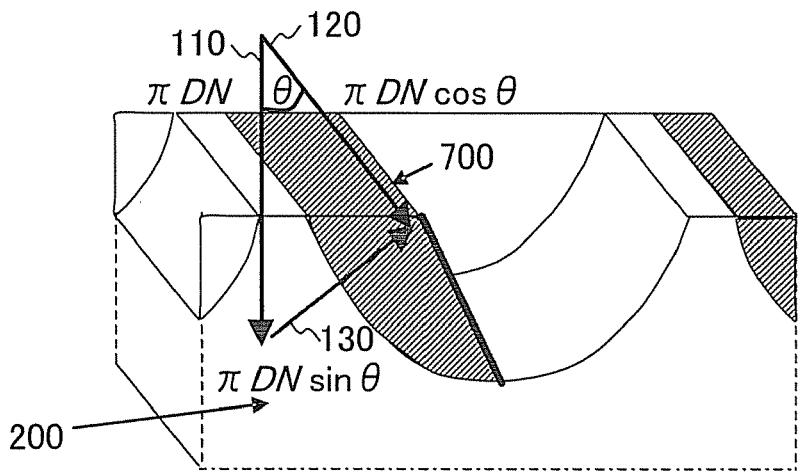
FIG. 6 is a schematic illustration of the flow state of nonvolatile mass solution containing volatile mass in the screw channel of the embodiment.

The three different profiles of the flow state shown in FIG. 4 will be discussed separately.
(1) The Profile of the Solution Existing on the Channel Surface at the Upstream Side in the Conveying Direction When the flow state of the nonvolatile mass solution containing volatile mass in the screw channel is simplified as shown in FIG. 6, it may be divided into two components including the velocity of flow of solution flowing along the screw flight and the velocity of flow of solution flowing perpendicularly relative to the screw flight that are functions of the rotational speed of the screw. The velocity of flow of solution flowing along the screw flight is defined as propulsion velocity of flow F(m/s) and the residence time of nonvolatile mass solution containing volatile mass in the devolatilization region is determined.

Figure 7:
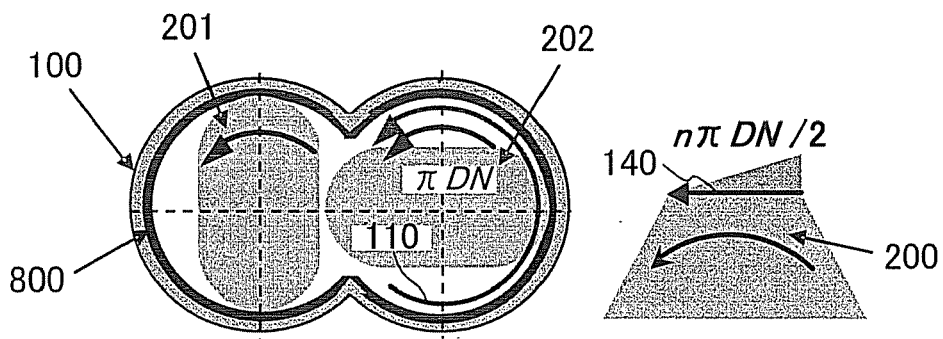
FIG. 7 is a schematic illustration of the profile and the flow state of nonvolatile mass solution containing volatile mass in the gap (tip section) between the barrel and the screw of the embodiment.

On the other hand, the velocity of flow of solution flowing perpendicularly relative to the screw flight is defined as surface updating velocity of flow E(m/s) and the length of the exposed surface formed by the surface updating flow within the residence time in the devolatilization region is led out. If the ratio of this length to the length of the exposed surface of a profile for which the filling ratio of the nonvolatile mass solution containing volatile mass filling the screw channel is taken into consideration but no surface update is taken into consideration, or $S_1$(m), is defined as surface update efficiency $K_1$, the equations shown below hold true:

$$K_1=(EL/F)/S_1 \qquad (6),$$

$$E=\pi DN \sin \theta/2 \qquad (7) \text{ and}$$

$$F=\pi DN \cos \theta/2 \qquad (8),$$

where L is the flow path length (m) of the nonvolatile mass solution containing volatile mass in the devolatilization region, D is the cylinder inner diameter (m), N is the screw rotational speed (s$^{-1}$) and $\theta$ is the helix angle (deg.) of the screw flight.
(2) The Profile of the Solution Existing in the Gap between the Screw and the Barrel The thin film of the solution 800 existing in the gap between the screw 200 and the barrel 100 as shown in FIG. 7 is influenced by the average peripheral speed G(m/s) at the tip section of the screw flight and the thin film of the polymer solution is updated by the average velocity of flow at the tip section. If the ratio of the time for updating the tip section at the average velocity of flow to the residence time in the devolatilization region is defined as surface update efficiency $K_2$, the equations shown below hold true:

$$K_2=(L/F)/(S_2/2G) \qquad (9),$$

$$S_2=2\pi D(360-2\cos^{-1}(W/D))/360 \qquad (10) \text{ and}$$

$$G=n\pi DN/2 \qquad (11),$$

where L is the flow path length (m) of the nonvolatile mass solution containing volatile mass in the devolatilization region, F is the propulsion velocity of flow (m/s) of the solution flowing along the screw flight, $S_2$ is the barrel inner surface length (m), D is the cylinder inner diameter (m), W is the inter-shaft distance of the twin-screw (m), n is the number of threads of the screw flight and N is the screw rotational speed (s$^{-1}$).
(3) The Profile of the Solution Existing on the Channel Surface at the Downstream Side in the Conveying Direction.

The thin film formed on the bottom of the screw channel is also influenced by the peripheral speed of the screw flight and updated in the intermeshing part of the twin-screw. If the ratio of the time for updating the tip section at the peripheral speed I(m/s) of the intermeshing part of the screw to the residence time in the devolatilization region is defined as surface update efficiency $K_3$, the equations shown below hold true:

$$K_3=(L/F)/(S_3/I) \qquad (12) \text{ and}$$

$$I=n\pi DN \qquad (13),$$

where L is the flow path length (m) of the nonvolatile mass solution containing volatile mass in the devolatilization region, F is the propulsion velocity of flow (m/s) of the solution flowing along the screw flight, $S_3$ is the totalized length (m) of the part of the bottom of the screw channel not fully filled with the nonvolatile mass solution containing volatile mass, n is the number of threads of the screw flight, D is the cylinder inner diameter (m) and N is the screw rotational speed ($s^{-1}$).

Figure 8:
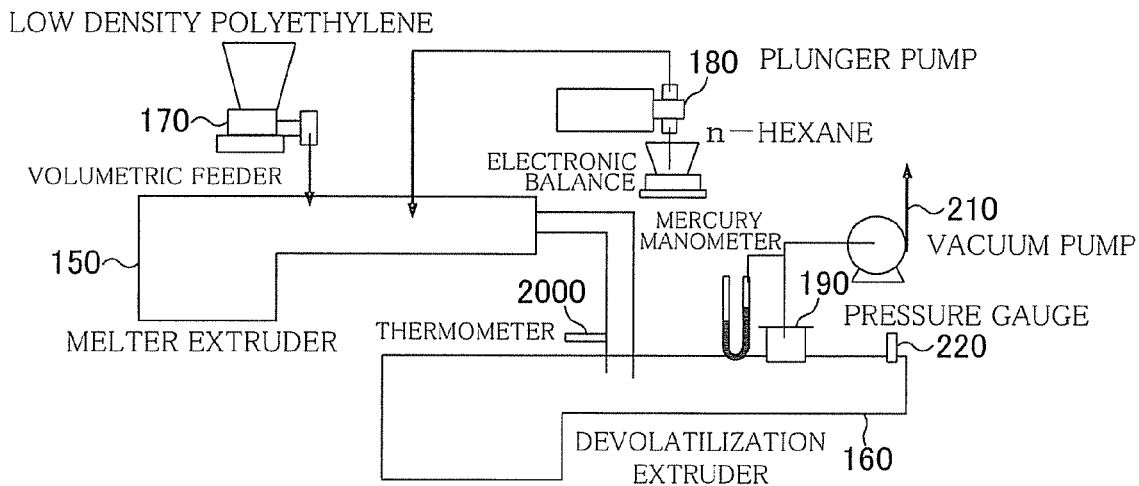
FIG. 8 is a schematic block diagram of the experiment apparatus used in a devolatilization experiment conducted for the purpose of the present invention.

FIG. 8 is a schematic block diagram of the experiment apparatus. A melter extruder for preparing an imitation material containing volatile mass was arranged at a higher level, while a twin-screw extruder for devolatilization is arranged at a lower level for the devolatilization experiment. Polymer pellets were supplied by means of a volumetric feeder 170 and molten, while a solvent that operates as volatile mass was supplied to the meter extruder by a metered quantity by means of a plunger pump 180. Subsequently, the polymer pellets were molten and dispersed satisfactorily in the solvent by means of the melter extruder. The prepared polymer solution was then supplied to a devolatilization extruder 160.

Figure 9:
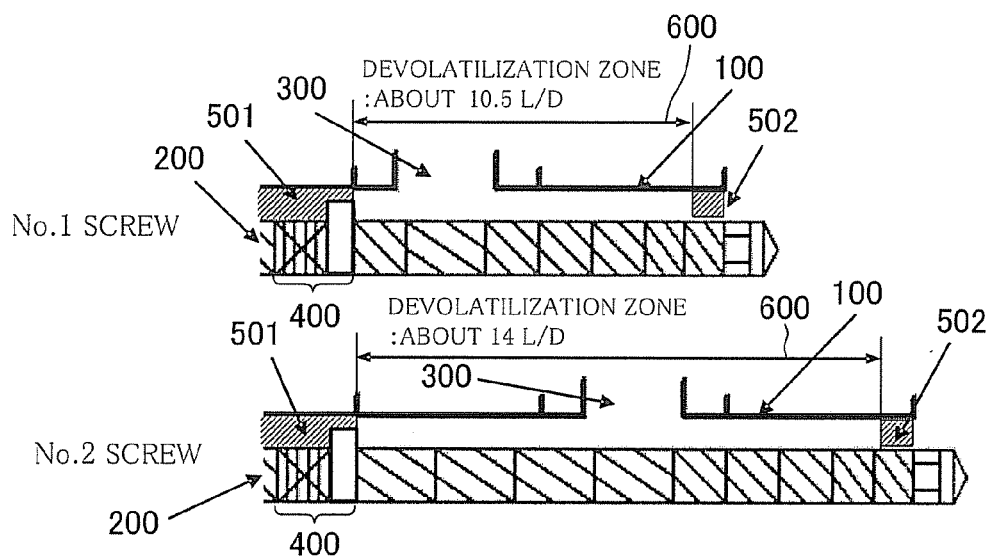
FIG. 9 is a schematic illustration of the screws used for the experiment, showing the profiles thereof.

The devolatilization twin-screw extruder 160 was an intermeshing type corotating twin-screw extruder (TEX65αII), available from The Japan Steel Works, that has a single vent. FIG. 9 shows the profiles of the screws used for the experiment including a No. 1 screw having a devolatilization region length of about 10.5 in terms of L/D and a No. 2 screw having a devolatilization region length of about 14 in terms of L/D. The devolatilization region of each of the two screws has a profile defined by a double-thread flight. The results obtained by the two screws were compared.

The used experiment material contained low density polyethylene (LDPE: MI=2/pellet profile) which was polymer and n-hexane which was volatile mass. A polymer solution containing n-hexane to a concentration of 0.3 wt % was prepared by means of the melter extruder 150 and supplied to the devolatilization twin-screw extruder 160 at a polymer solution temperature of 190° C. The polymer solution temperature was observed by means of a thermocouple type resin thermometer 2000 arranged at the polymer pipe linking the melter extruder and the devolatilization twin-screw extruder.

A total of five levels were used as devolatilization conditions. They include two levels of a processing rate of 150 kg/h and a processing rate of 250 kg/h, three Q/N levels of 0.75, 1.00 and 1.50 for the processing rate of 150 kg/h and two Q/N levels of 1.00 and 1.50 for the processing rate of 250 kg/h. The barrel temperature was held to 200° C. as a whole and the vacuum degree was controlled to $4 \times 10^{-3}$ MPa. The pressure of the polymer solution being extruded from the extruder was observed by means of a diaphragm type pressure gauge 220 arranged at the front end of the devolatilization extruder, while the temperature of the polymer solution being extruded from the extruder was observed by means of a thermocouple type handy thermometer. The ejected polymer solution was sampled and the concentration of volatile mass was measured by way of a gas chromatograph process.

FIG. 10 summarily shows the results of the experiment. The adaptability of the prediction formula shown below was confirmed by the results of the experiment shown in FIG. 10.

$$Ln(C_0-C^*)/(C_L-C^*)=(K_1(2n-1)\rho S_1 L(DdN)^{1/2}+\beta K_2 \rho S_2 L_2(DdN)^{1/2}+\gamma K_3 \rho S_3 L(DdN)^{1/2})/Q \quad (5)$$

Figure 11:
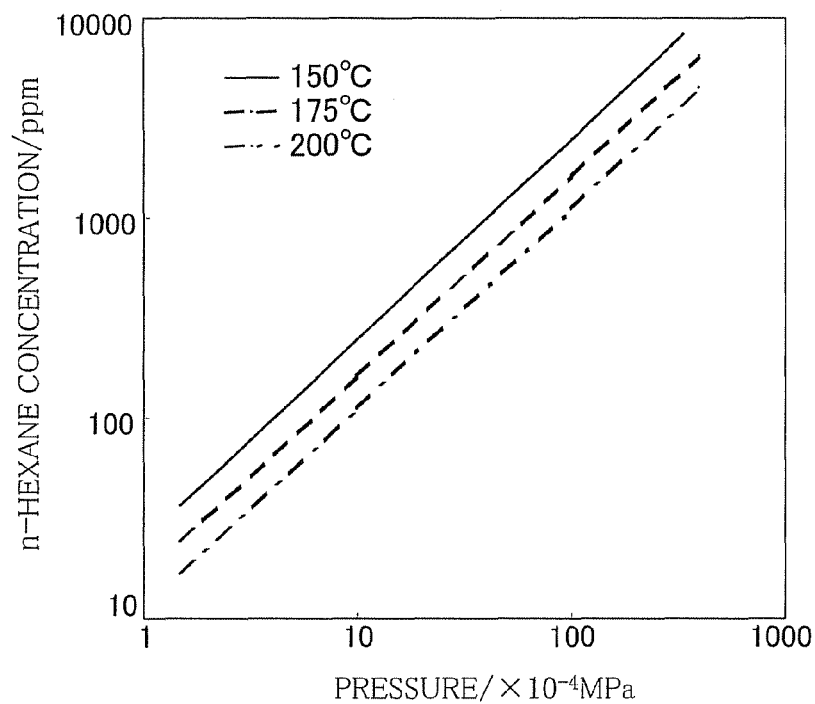
FIG. 11 is a gas-liquid equilibrium concentration graph of polyethylene and n-hexane.
Figure 12:
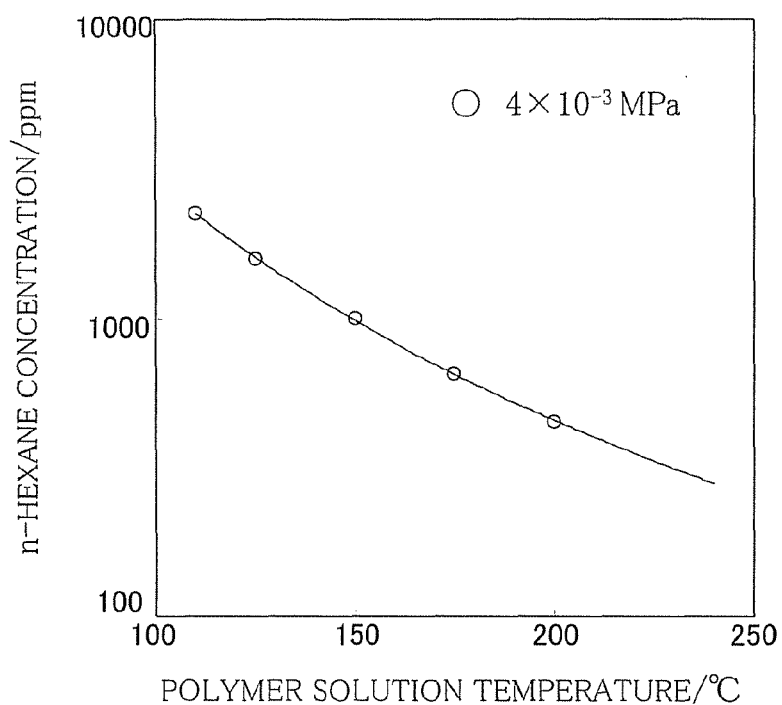
FIG. 12 is a graph showing the temperature dependency of gas-liquid equilibrium concentration of polyethylene and n-hexane.

Firstly, of the left side term of the above prediction formula, $C_0$ and $C_L$ can be obtained from the results of the experiment. As for C*, the equilibrium concentration graph as shown in FIG. 11 was determined from the formula shown below, using the Henry's constants H (MPa) for polyethylene and n-hexane, and the equilibrium concentration relative to the polymer solution temperature when the vacuum degree is $4 \times 10^{-3}$ MPa was computationally determined to obtain the graph of FIG. 12:

$$C^*=P/H \quad (14),$$

where P is the vacuum degree (MPa) in the devolatilization region.

Since the temperature rise of the polymer was small during the transfer, the polymer solution temperature in the devolatilization region was assumed to be subsequently same as the ejected resin temperature for determining the equilibrium concentration for each of the devolatilization conditions.

Now, as for the right side terms of the above prediction formula, the polymer flow paths of the screw that were not fully filled parts were determined from the profile of the part of the screw that operates for the devolatilization region and totalized as the polymer solution flow path length L of the devolatilization region. On the other hand, the length of the devolatilization region in the direction of the screw shafts was used as $L_2$ because the profile of the polymer solution in the gap of the barrel 100 and the screw 200 was not attributable to the polymer solution flow path of the screw 200.

Since the volatile mass was contained to a small extent, the density of molten polyethylene, which is 750 kg/$m^3$, was used as the density ρ of the polymer solution.

Considering the state of the thin film formed due to a viscosity difference of polymer solution, it is generally predictable that a thin film of polymer solution is completely formed in the gap between the barrel and the screw and also in the intra-screw gap when the viscosity of the polymer solution is low. On the other hand, it is not clear to what extent a thin film of polymer solution is formed in the gap between the barrel and the screw and also in the inter-screw gap when the viscosity of the polymer solution is high. Therefore, the two techniques listed below were employed to evaluate the above prediction formula.

(a) When a thin film is completely formed in the gap between the barrel and the screw and also in the intra-screw gap (when the viscosity of the polymer solution is low and the filling efficiencies β and γ are equal to 1)

Figure 13:
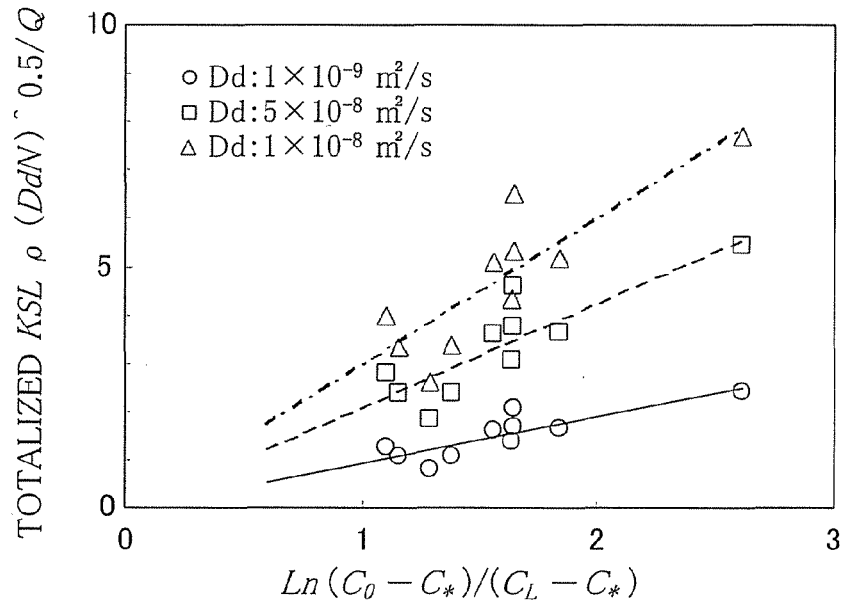
FIG. 13 is a graph showing the correlation of the left side term and the right side terms of the prediction formula of this embodiment computationally determined by changing the diffusion rate of n-hexane on the basis of the results of the experiment.

The dispersion coefficient of volatile mass from polymer is generally considered to be $10^{-8}$ to $10^{-12}$ $m^2$/s. Therefore, $1 \times 10^{-8}$, $5 \times 10^{-9}$ and $1 \times 10^{-9}$ $m^2$/s were selected as diffusion coefficients of volatile mass and the results of the experiment was computationally obtained by means of the above prediction formula. FIG. 13 shows the relationship between the left side term and the right side terms of the prediction formula.

From FIG. 13, it will be seen that the left side and the right side of the prediction formula show a proportional relationship, although they show differences depending on the diffusion coefficient Dd of volatile mass.

Additionally, the left side and the right side of the prediction formula was substantially equal to each other when the diffusion coefficient Dd of volatile mass was $1 \times 10^{-9}$ $m^2$/s.

In the case of a low viscosity n-hexane-polyethylene based solution, it was found that the use of a diffusion coefficient Dd of $1 \times 10^{-9}$ $m^2$/s is appropriate.

(b) When a thin film is formed in part of the gap between the barrel and the screw and also in the inter-screw gap (when the viscosity of the polymer solution is high and the filling efficiencies β and γ vary)

Figure 14:
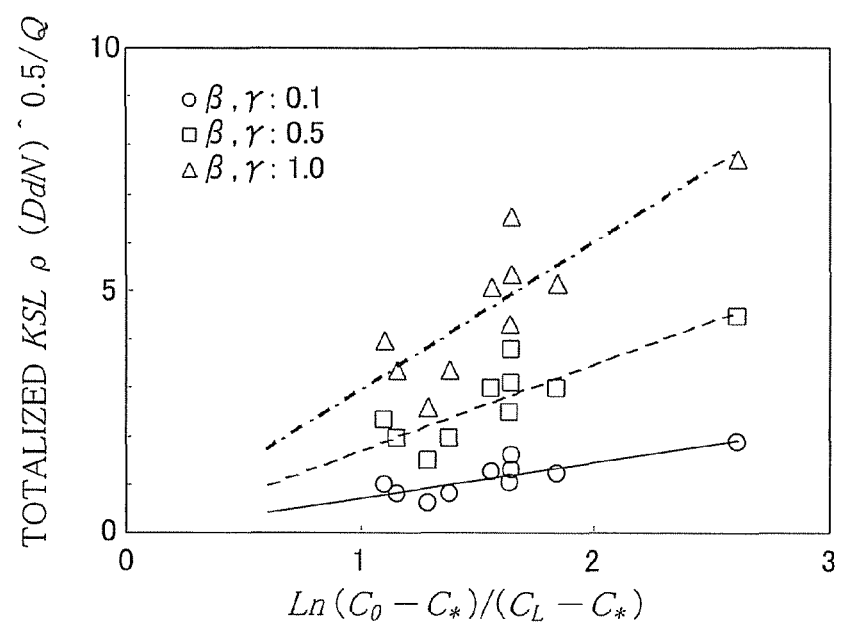
FIG. 14 is a graph showing the correlation of the left side term and the right side terms of the prediction formula of this embodiment computationally determined by changing the filling efficiency of polymer solution on the basis of the results of the experiment.

It is clear that the value of the left side remarkably differs from the value of the right side of the prediction formula by lowering filling efficiency when the diffusion coefficient Dd of $1 \times 10^{-9}$ $m^2$/s that was obtained for a low viscosity n-hexane-polyethylene based solution in (a) above is employed. FIG. 14 shows the relationship between the left side and the right side of the prediction formula when the general upper limit value of diffusion coefficient of $1 \times 10^{-8}$ m²/s is employed for the diffusion coefficient Dd and 0.1, 0.5 and 1 are selected for the polymer solution filling efficiency β.

From FIG. 14, it is found that the value of the left side and that of the right side show a remarkable difference when the polymer solution filling efficiency β is not less than 0.5, whereas the value of the left side relatively satisfactorily agree with that of the right side when the polymer solution filling efficiency β is between 0.1 and 0.5.

This suggests that a thin film is formed only to cover not more than 50% of the surface area of the screw channel when the viscosity is high.

From the results described above, the prediction formula is highly adaptable when the diffusion coefficient of volatile mass from polymer and the filling efficiency due to the viscosity of polymer solution are taken into consideration.

Now, the devolatilization performance prediction method of the devolatilization performance prediction means 102 will be described in greater detail below.

A devolatilization performance prediction by the devolatilization performance prediction means 102 in the devolatilization performance prediction apparatus M of this embodiment corresponds to a prediction of devolatilization capacity (or a prediction of the concentration $C_L$ of volatile mass contained in a nonvolatile mass solution after a devolatilization process).

More specifically, the devolatilization performance prediction means 102 adopts the factors (a) through (e) listed below:
(a) characteristic factors of volatile mass, nonvolatile mass and nonvolatile mass solution containing volatile mass: $C_0$, C*, Dd and ρ,
(b) profile factors of screw and barrel: L, $L_2$ and n,
(c) operating conditions of twin-screw extruder: N and Q
(d) combination factors of (b) and (c): $K_1$, $K_2$ and $K_3$, and
(e) combination factors of (a) through (c) (or the formation state and the flow state of material solution produced between the screw and the barrel under the operating conditions): $S_1$, $S_2$, $S_3$, β and γ, and predicts the concentration $C_L$ of volatile mass after a devolatilization process (exist condition) (which corresponds to the devolatilization performance of a twin-screw extruder after a devolatilization process) by substituting "the entrance conditions of the material", "the material characteristics", "the screw profile (dimensions)", "the barrel arrangement (dimensions)" and "the operating conditions" for them in the formula (5).

Figure 15:
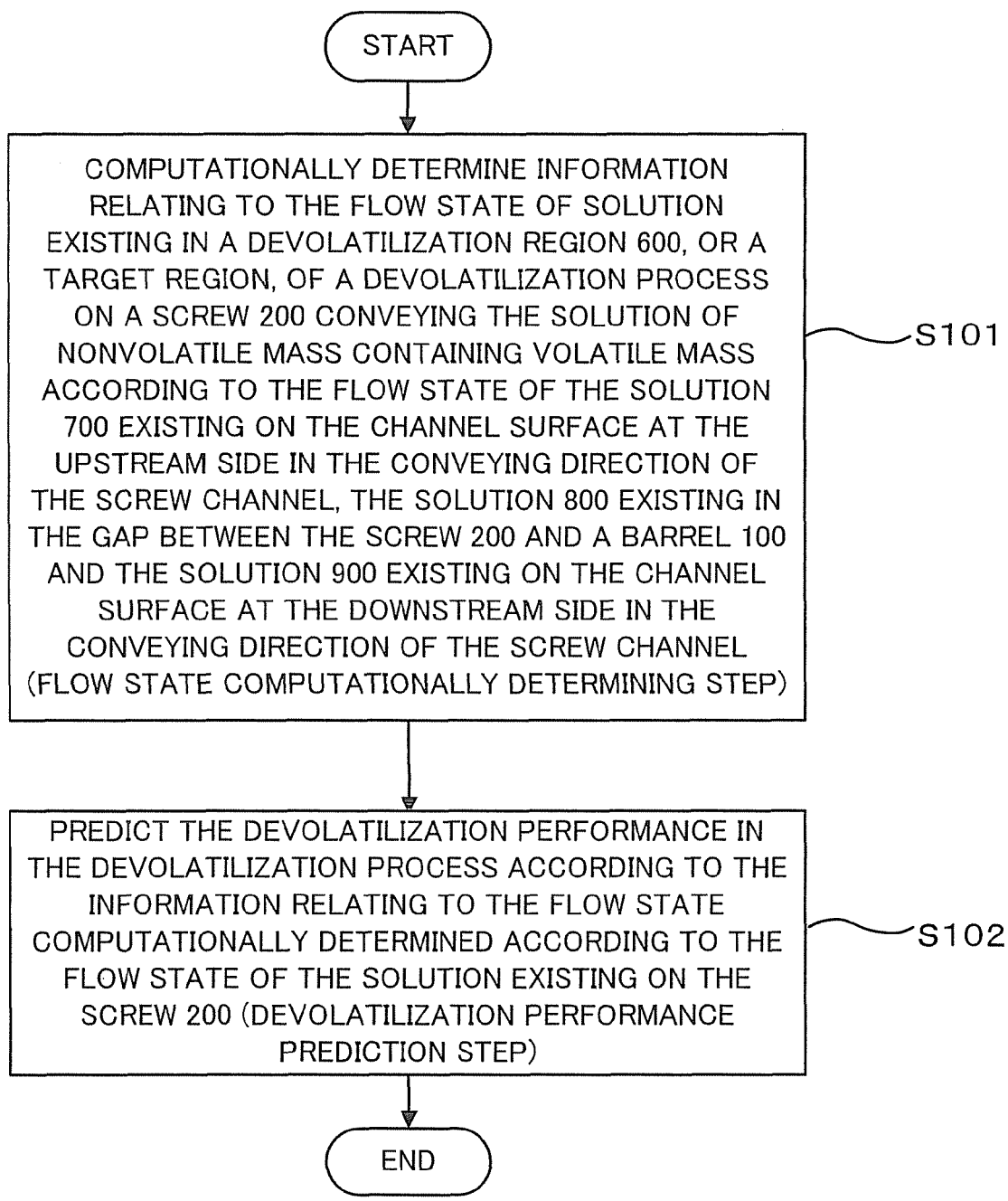
FIG. 15 is a flowchart of the process (devolatilization performance prediction method) of the devolatilization performance prediction apparatus M of this embodiment.

FIG. 15 is a flowchart of the process that the devolatilization performance prediction apparatus M of this embodiment executes (the devolatilization performance prediction method).

The flow state computation section 101 computationally determines information relating to the flow state of the solution existing in a devolatilization region 600, or a target region, of a devolatilization process on a screw 200 conveying solution of nonvolatile mass containing volatile mass according to the flow state of the solution 700 existing on the channel surface at the upstream side in the conveying direction of the screw channel, the solution 800 existing in the gap between the screw 200 and a barrel 100 and the solution 900 existing on the channel surface at the downstream side in the conveying direction of the screw channel (flow state computationally determining step) (S101).

The devolatilization performance prediction means 102 predicts the devolatilization performance in the devolatilization process according to the information relating to the flow state computationally determined according to the flow state of the solution existing on the screw 200 (devolatilization performance prediction step) (S102).

More specifically, the embodiment predicts the devolatilization performance of a devolatilization process according to the formula shown below:

$$Ln(C_0-C^*)/(C_L-C^*)=(K_1(2n-1)\rho S_1 L(DdN)^{1/2}+ \beta K_2 \rho S_2 L_2(DdN)^{1/2}+\gamma K_3 \rho S_3 L(DdN)^{1/2})/Q \quad (5),$$

where L is the flow path length of the nonvolatile mass solution containing volatile mass in the devolatilization region (600), $L_2$ is the length of the devolatilization region in the direction of the screw shafts, $C_0$ is the volatile mass concentration at the entrance of the devolatilization region, C* is the gas-liquid equilibrium concentration of volatile mass and nonvolatile mass under the pressure/temperature conditions for devolatilization, $C_L$ is the volatile mass concentration after devolatilization, $K_1$ is the ratio of the length of the exposed surface formed by a surface update flow within the residence time of staying in the devolatilization region to the length of the exposed surface of a profile for which no surface update is taken into consideration, $K_2$ is the ratio of the time taken to update the exposed surface at the average velocity of flow between the barrel (100) and the screw (200) to the residence time in the devolatilization region, $K_3$ is the ratio of the time taken for updating the exposed surface at the peripheral speed of the intermeshing part of the screw to the residence time in the devolatilization region, ρ is the density of the nonvolatile mass solution containing volatile mass, $S_1$ is the length of the exposed surface of a profile for which the filling ratio of the nonvolatile mass solution containing volatile mass filling the screw channel is taken into consideration but no surface update is taken into consideration, $S_2$ is the barrel inner surface length, $S_3$ is the length of the part of the screw channel not fully filled with solution, Dd is the diffusion coefficient of the volatile mass contained in the nonvolatile mass solution containing volatile mass, N is the screw rotational speed, n is the number of threads of the screw flight, β is the thin film forming efficiency of forming a thin film of solution in the gap produced between the barrel (100) and the screw (200), γ is the thin film forming efficiency of forming a thin film in the part of the screw channel not fully filled with solution and Q is the overall processing rate.

Note that the flow state of the solution 700 existing on the screw channel at the upstream side in the conveyance direction, the flow state of the solution 800 existing in the gap between the screw 200 and the barrel 100 and the flow state of the solution 900 existing on the screw channel at the downstream side in the conveyance direction are computationally determined by using formulas similar to the above formulas (6) through (3).

The above-described steps of the process that the devolatilization performance prediction apparatus M executes are realized by causing the CPU 801 to execute the devolatilization performance prediction program stored in the MEMORY 802.

As described above by way of an embodiment, the present invention can solve the problem that a screw type extruder utilizing a Latinen's model formula faces when predicting the devolatilization performance of a screw type extruder by providing a highly adaptive devolatilization performance prediction method that takes the flow behavior of the nonvolatile mass solution containing volatile mass existing in the gap between the barrel and the screw into consideration when the nonvolatile mass solution containing volatile mass is being conveyed by the conveyer screw in a not fully filled state to produce a new model of dividing the filling state of the solution existing in barrel and on the screw channel per unit time into three profiles that are different in terms of flow state at a cross section orthogonal relative to the screw flight and examine each of the flow states, newly introducing a concept of surface update efficiency.

While the present invention is described above in detail by way of a specific embodiment, the present invention is by no means limited thereto and it may be clear to those skilled in the art that the above-described embodiment can be modified and altered in various different ways without departing from the scope of the invention.

Industrial Applicability

As described above, the present invention provides a technique that can very accurately predict the devolatilization performance of a twin-screw extruder in a highly adaptive manner.

The invention claimed is:

1. A devolatilization performance prediction apparatus for a solution devolatilization process using a twin-screw extruder, comprising:
   at least one memory that stores computer-executable instructions;
   at least one processor, communicatively coupled to the memory, that executes the computer-executable instructions to at least:
   determine a flow state of a solution comprising nonvolatile mass and volatile mass that partially fills a channel of the two-screw extruder in a devolatilization region by considering a flow state of the solution in a first part of the devolatilization region, a second part of the devolatilization region, and a third part of the devolatilization region;
   simulate a devolatilization process for the solution with the determined flow state; and
   predict a performance of a devolatilization process conducted with the twin-screw extruder based on the simulation according to:

$$Ln(C_0-C^*)/(C_L-C^*)=(K_1(2n-1)\rho S_1 L(DdN)^{1/2}+\beta K_2 \rho S_2 L_2(DdN)^{1/2}+\gamma K_3 \rho S_3 L(DdN)^{1/2})/Q,$$

where L is the flow path length of the solution, $L_n$ is the length of the devolatilization region in the direction of the screw shafts, $C_0$ is the volatile mass concentration at the entrance of the devolatilization region, $C^*$ is the gas-liquid equilibrium concentration of volatile mass and nonvolatile mass under the pressure/temperature conditions for devolatilization, $C_L$ is the volatile mass concentration after devolatilization, $K_1$ is a parameter for flow state of solution in the first part of the devolatilization region, $K_2$ is a parameter for flow state of solution in the second part of the devolatilization region, $K_3$ is a parameter for flow state of solution in the third part of the devolatilization region, $\rho$ is the density of the nonvolatile mass solution containing volatile mass, $S_1$ is the length of the first part of the devolatilization region, $S_2$ is the barrel inner surface length, $S_3$ is the length of the part of the screw channel not fully filled with solution, Dd is the diffusion coefficient of the volatile mass contained in the nonvolatile mass solution containing volatile mass, N is the screw rotational speed, n is the number of threads of the screw flight, $\beta$ is the thin film forming efficiency of forming a thin film of solution in the gap produced between the barrel and the screw, $\gamma$ is the thin film forming efficiency of forming a thin film in a part of the channel not fully filled with solution and Q is the overall processing rate.

2. The apparatus according to claim 1, wherein the at least one processor executes the computer-executable instructions to at least: determine the flow state of the solution in the first part of the devolatilization region by considering solution existing on the channel surface of the screw channel at the upstream side in the conveyance direction according to:

$$K_1=(EL/F)/S_1,$$

$$E=\pi DN \sin \theta/2 \text{ and}$$

$$F=\pi DN \cos \theta/2,$$

where F is the propulsion velocity of flow of the solution flowing along the screw is the helix☐flight, E is the velocity of flow of the surface updating flow, angle of the screw flight.

3. The apparatus according to claim 1, wherein the at least one processor executes the to: determine the flow state of the solution in the second part of the devolatilization region by considering solution existing in the gap between the screw and the barrel according to:

$$K_2=(L/F)/(S_2/2G)$$

$$S_2=2\pi D(360-2\cos^{-1}(W/D))/360 \text{ and}$$

$$G=n\pi DN/2,$$

where F is the propulsion velocity of flow of the solution flowing along the screw flight, G is the average peripheral speed at the screw tip section and W is the inter-shaft distance of the twin-screw.

4. The apparatus according to claim 1, wherein the at least one processor executes the computer-executable instructions to: determine the flow state of the solution in the third part of the devolatilization region by considering solution existing on the channel surface of the screw channel at the downstream side in the conveyance direction by means of the formulas shown below:

$$K_3=(L/F)/(S_3/I) \text{ and}$$

$$I=n\pi DN,$$

where F is the propulsion velocity of flow of the solution flowing along the screw flight and I is the peripheral speed of the intermeshing part of the screw.

5. A devolatilization performance prediction method for a solution devolatilization process using a twin-screw extruder, comprising:
   determining, using a hardware processor, a flow state of a solution comprising nonvolatile mass and volatile mass that partially fills a channel of the two-screw extruder in a devolatilization region by considering a flow state of the solution in a first part of the devolatilization region, a second part of the devolatilization region, and a third part of the devolatilization region;
   simulating a devolatilization process for the solution with the determined flow state; and
   predicting a performance of a devolatilization process conducted with the twin-screw extruder based on the simulation according to:

$$Ln(C_0-C^*)/(C_L-C^*)=(K_1(2n-1)\rho S_1 L(DdN)^{1/2}+\beta K_2 \rho S_2 L_2(DdN)^{1/2}+\gamma K_3 \rho S_3 L(DdN)^{1/2})/Q,$$

where L is the flow path length of the nonvolatile mass solution containing volatile mass in the devolatilization region, $L_2$ is the length of the devolatilization region in the direction of the screw shafts, $C_0$ is the volatile mass concentration at the entrance of the devolatilization region, $C^*$ is the gas-liquid equilibrium concentration of volatile mass and nonvolatile mass under the pressure/temperature conditions for devolatilization, $C_L$ is the volatile mass concentration after devolatilization, $K_1$ is a parameter related to the first part, $K_2$ is the ratio of the time taken to update the exposed surface at the average velocity of flow between the barrel and the screw to the residence time in the devolatilization region, $K_3$ is the ratio of the time taken for updating the exposed surface at the peripheral speed of the intermeshing part of the screw to the residence time in the devolatilization region, $\rho$ is the density of the nonvolatile mass solution containing volatile mass, $S_1$ is the length of the first region, $S_2$ is the barrel inner surface length, $S_3$ is the length of the part of the screw channel not fully filled with solution, Dd is the diffusion coefficient of the volatile mass contained in the nonvolatile mass solution containing volatile mass, N is the screw rotational speed, n is the number of threads of the screw flight, $\beta$ is the thin film forming efficiency of forming a thin film of solution in the qap produced between the barrel and the screw, $\gamma$ is the thin film forming efficiency of forming a thin film in the part of the screw channel not fully filled with solution and Q is the overall processing rate.

6. The method according to claim 5, wherein the determining further comprises determining the flow state in the first part by means of the formulas shown below:

$K_1 = (EL/F)/S_1$, $E = \pi DN \sin \theta/2$ and $F = nDN \cos \theta/2$, where F is the propulsion velocity of flow of the solution flowing along the screw flight, E is the velocity of flow of the surface updating flow, $\theta$ is the helix angle of the screw flight.

7. The method according to claim 5, wherein determining further comprises determining the flow state in the second part by means of the formulas shown below:

$K_2 = (L/F)/(S_2/2G)$ $S_2 = 2\pi D(360 - 2\cos^{-1}(W/D))/360$ and $G = n\pi DN/2$, where F is the propulsion velocity of flow of the solution flowing along the screw flight, G is the average peripheral speed at the screw tip section and W is the inter-shaft distance of the twin-screw.

8. The method according to claim 5, wherein determining further comprises determining the flow state in the third part by means of the formulas shown below:

$K_3 = (L/F)/(S_3/I)$ and $I = n\pi DN$, where F is the propulsion velocity of flow of the solution flowing along the screw flight and I is the peripheral speed of the intermeshing part of the screw.

* * * * *